United States Patent [19]

Akselrad et al.

[11] 4,018,692
[45] Apr. 19, 1977

[54] COMPOSITION FOR MAKING GARNET FILMS FOR IMPROVED MAGNETIC BUBBLE DEVICES

[75] Inventors: Aline Akselrad, Princeton; Richard Edwin Novak, East Windsor, both of N.J.

[73] Assignee: RCA Corporation, New York, N.Y.

[22] Filed: Mar. 13, 1975

[21] Appl. No.: 558,146

Related U.S. Application Data

[63] Continuation of Ser. No. 403,393, Oct. 4, 1973, abandoned.

[52] U.S. Cl. .............................. 252/62.57; 106/42; 340/174 TF
[51] Int. Cl.² ................... G11C 19/08; C04B 35/40
[58] Field of Search ............ 340/174 TF; 252/62.57

[56] References Cited

UNITED STATES PATENTS

| | | | |
|---|---|---|---|
| 3,281,363 | 10/1966 | Geller et al. | 252/62.57 |
| 3,646,529 | 2/1972 | Bobeck et al. | 340/174 TF |
| 3,735,145 | 5/1973 | Heinz | 340/174 TF |

OTHER PUBLICATIONS

Bell Laboratories Record – "Garnets for Bubble Domain Devices" by Levinstein et al; July–Aug. 1973; pp. 209–214.

*Primary Examiner*—James W. Moffitt
*Attorney, Agent, or Firm*—Glenn H. Bruestle; H. Christoffersen; B. E. Morris

[57] ABSTRACT

Garnet films suitable for bubble devices which are substituted with bismuth, aluminum or gallium and certain rare earth ions have improved magneto optic properties and can be formed at low temperatures on gadolinium gallium garnet substrates.

2 Claims, 3 Drawing Figures

COMPOSITION FOR MAKING GARNET FILMS FOR IMPROVED MAGNETIC BUBBLE DEVICES

This is a continuation of application Ser. No. 403,393, filed Oct. 4, 1973 now abandoned.

This invention relates to novel magnetic garnet films and devices incorporating them. More particularly, this invention relates to novel magnetic garnet films, a process for making them and bubble domain devices incorporating them which display improved magneto-optic capabilities.

BACKGROUND OF THE INVENTION

Magnetic devices, commonly referred to as bubble domain devices, depend on the use of materials which can maintain and propagate small cylindrical domains or bubbles of reversed magnetization in appropriate magnetic fields. These materials are generally in the form of thin single crystals supported on a non-magnetic, compatible substrate having a matching lattice constant. The devices comprise a film of magnetic bubble material, means for generating localized reversed domains, means for propagating the domains along a predetermined path, such as a conductor circuit, to another portion of the film and means for detecting the presence of the bubbles. The latter is generally accomplished by magneto-resistive techniques which detects the presence of a bubble as an information bit. A high bit density, or small bubble size, for a given film is generally desirable within the limits of conventional photolithiographic fabrication techniques used to make the propagation circuits. Materials research to date has resulted in garnet materials which can form bubbles less then 1 mil in diameter, preferably about ¼ – ⅓ mil in diameter, so as to obtain a bit density of $10^5$ to $10^6$ bits/square inch of film. However, the bubbles must be greatly expanded, e.g., about 100 – 300 times, in order to detect them by magneto-resistive techniques and this results in a large decrease in the useful area of a particular film on which information can be stored.

Magneto optic techniques have also been tried for detecting bubbles, but in magnetic bubble materials available heretofore, the optical properties, particularly Faraday rotation, are low and high powered lasers or very sensitive light detectors are required to detect the presence or absence of bubbles optically.

Magnetic materials, to be suitable as bubble materials, must satisfy the following general requirements: they must have a uniaxial magnetic anisotropy ($K\mu$) with the easy axis of magnetization perpendicular to the film surface; and they must have a saturation magnetization ($4\pi Ms$) such that $$K\mu > 2\pi Ms^2.$$

Owing to their cubic magnetic anisotropy, simple garnets such as YIG are unsuitable for bubble device applications. Liquid phase epitaxial films of doped garnets can acquire uniaxial anisotropy as a result of ionic segregation that occurs during growth. To satisfy the requirements given above, the saturation magnetization of doped garnets is reduced by substituting gallium or aluminum for some of the tetrahedral iron ions. Known garnets are temperature sensitive, such that close control of temperature during operation of devices incorporating them is required.

In addition to the magnetic and optical properties required or desirable for good bubble materials employed in conjunction with magneto-optic bubble detection, the films should also be able to be grown as thin, defect free, single crystal films onto a supporting compatible substrate. Preferably, single crystal films are grown by liquid phase epitaxial techniques from a suitable flux. A lattice constant match within about 0.002 Angstroms is required between the film and that of commercially available substrates, such as gadolinium gallium garnet.

SUMMARY OF THE INVENTION

We have discovered certain bismuth doped magnetic garnet compositions which have a high Faraday rotation in the visible and infrared wavelength range and in addition have magnetic properties required for bubble materials, e.g., growth induced uniaxial anisotropy. Such materials can be incorporated into bubble devices wherein the bubbles can be detected optically. These compositions can be grown from a suitable flux by conventional epitaxial techniques at low temperatures in the form of single crystal, strain-free films directly onto a nonmagnetic garnet substrate.

DETAILED DESCRIPTION OF THE INVENTION

Figure 1:
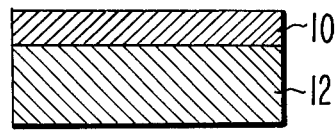
FIG. 1 shows a single crystal garnet film on a substrate suitable for use in a bubble device.

The new bismuth doped magnetic garnet compositions have the formula $\{Bi_xA_{3-x}\}[Fe_2](Fe_{3-y}M_y)O_{12}$ wherein M is gallium or aluminum or both, $y$ can range from about 0.6 up to about 1.2, $x(3-y)$ is equal to or more than 1.2 and A is $Y^{3+}$ and/or one or more trivalent rare earth ions. The rare earth metals include the elements having atomic numbers of 57 to 72. Suitable rare earth ions for use in garnet films are well known. The desired magnetic moment of 30 to 500 Gauss is obtained by proper choice of $y$, as is known. When the garnet film is to be grown onto a gadolinium gallium garnet substrate, and when M is gallium, A is preferably one or more ions selected from the group consisting of thulium, ytterbium, yttrium and lutecium; when M is aluminum, A is preferably one or more ions selected from the group consisting of thulium, ytterbium, yttrium, lutecium, erbium and europium. The choice among these ions will be determined by the size of the bubble domain desired, the speed of propagation or mobility of the bubbles desired and the maximum temperature sensitivity which can be tolerated. For example, very small bubbles with high mobility will be obtained when A is lutecium and M is gallium. Relatively temperature stable compositions giving bubbles about 6 microns in diameter contain bismuth, thulium and gallium. The addition of small amounts of vanadium, silicon or calcium may improve the stoichiometry and reduce the optical absorption of the garnet films described above.

The magnetic garnet compositions described above can be grown onto a suitable substrate support by conventional liquid phase epitaxial techniques using an appropriate flux composition. A flux composition may be chosen from the lead oxide-bismuth oxide-iron oxide ternary phase diagram and used to dissolve the remaining garnet constituents. It is to be noted that the presence of boron trioxide, generally added to lead oxide fluxes, is not desirable since boron trioxide increases the viscosity and increases the temperature required for growth of the crystal. The increased viscosity would preclude the growth of high quality films at the lower temperatures, and the increased temperature required would decrease the amount of bismuth able to be added to the garnet composition. Flux compositions having a low melting point range contain about 75 mol percent of lead oxide, about 15 mol percent of bismuth oxide and about 10 mol percent of iron oxide. Using such a flux, and including additional desired garnet constituents as their oxides, growth can proceed at temperatures of 740° to 780° C. under isothermal conditions. The low temperature increases the amount of bismuth which can be incorporated into the growing magnetic garnet film, thereby increasing its Faraday rotation.

The crystals are grown by melting the flux and garnet components and bringing the melt to the desired temperature. The substrate is then lowered into the molten solution and the desired garnet composition grows onto the substrate. Growth of the single crystal film is continued until the desired thickness is obtained, generally about 3–20 microns, depending on the size of the bubbles desired. For example, when ¼ mil diameter bubbles are desired, the films can be from about 3–12 microns thick.

The magnetic garnet compositions as described hereinabove are excellent media for bubble propagation. The bubbles can be detected optically, thus increasing the film space available for information storage. The single crystal garnet films described above can also be employed in page composers and other information processing devices. The garnet films can be employed in a bubble device with a shift register with magneto-optic readout using a low power laser or solid state light emitting diode as the light source and a conventional silicon photo detector.

Referring now to the drawings, FIG. 1 shows a single crystal garnet film 10 as described above epitaxially grown onto a gadolinium gallium garnet substrate wafer 12.

Figure 2:
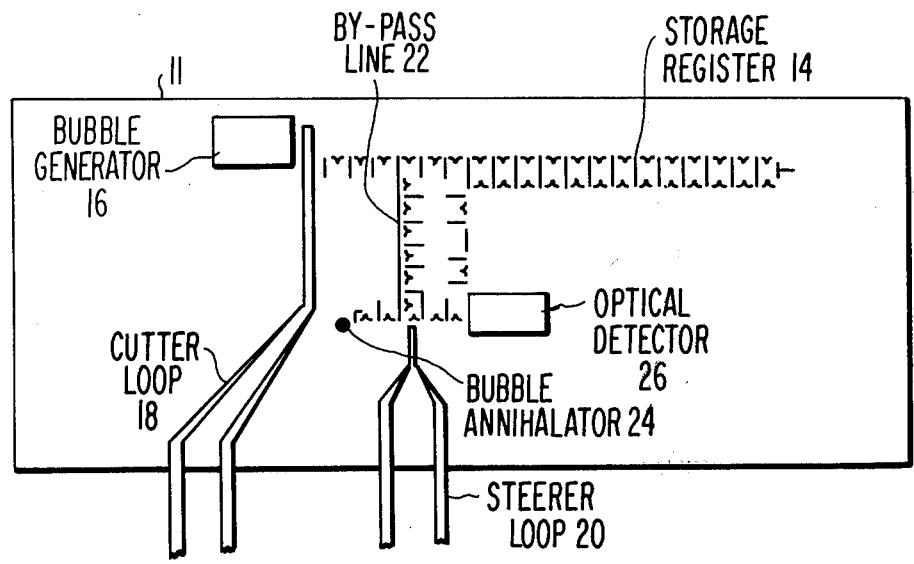
FIG. 2 is a schematic representation of a magnetic bubble device utilizing a single crystal garnet film of the invention and magneto-optic detection.

FIG. 2 is a schematic view of a bubble device including the single crystal garnet film 10 shown in FIG. 1 upon which is overlaid a Y-bar nickel-iron storage register 14 whereby bubbles can be propagated from one section of the film to another. The bar widths and spacings are chosen so that they are appropriate for the size of the bubbles being propagated. The device also includes a nickel-iron bubble generator 16 with a gold cutter loop 18, a bubble steerer loop 20, a by-pass line 22 for recirculation of the bubbles, a bubble annihalator 24 and an optical detector 26.

Figure 3:
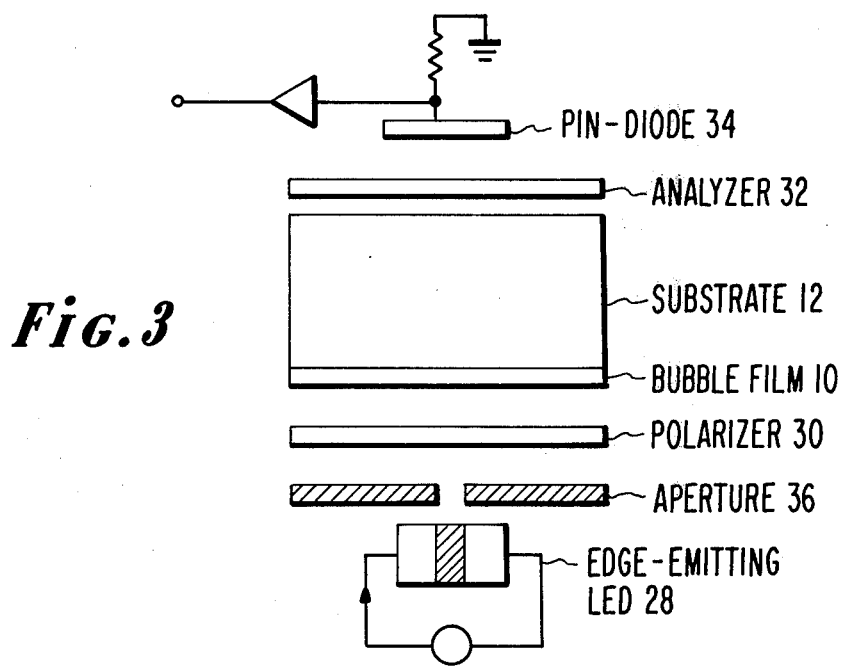
FIG. 3 is an exploded view of the magneto-optic detection system.

FIG. 3 is a schematic exploded view of the optical bubble detector 26. The detector 26 comprises an edge-emitting light-emitting diode 28, a polarizer 30, the single crystal film 10 on the substrate wafer 12, an analyzer 32 and a silicon PIN photodiode 34. An aperture 36 is optionally provided between the edge-emitting light-emitting diode 28 and the polarizer 30 to enhance detection of the bubbles.

The invention will be further illustrated by the following example but it is to be understood that the invention is not meant to be limited to the details described therein.

EXAMPLE

A bismuth doped magnetic garnet film on a gadolinium gallium garnet substrate was grown as follows: a platinum crucible 1¾ inches in diameter and 2 inches high containing 15 mol percent of bismuth oxide, 0.48 mol percent of thulium oxide, 8.40 mol percent of iron oxide, 1.12 mol percent of gallium oxide and 75.0 mol percent of lead oxide was charged to a two zone resistance heated furnace having a 6 centimeter isothermal growth zone. The crucible was heated at 1080° C. to dissolve the components and then held at 780° C. ± ½° C. An epitaxially polished (111) gadolinium gallium garnet wafer suspended by a platinum fixture attached to an alumina rod and rotated by a variable speed motor was immersed into the crucible. The rod was rotated at 100 revolutions per minute and growth rates of 1–1.5 microns/minute were observed. At the end of growth, the excess flux was spun off at 500 revolutions per minute.

The resultant transparent light brown garnet film had the composition $Bi_{0.594}Tm_{2.338}Fe_{4.02}Ga_{0.98}O_{12}$ and a uniform thickness of 6.8 ± 0.12 microns. A small amount of lead, 0.33 mol percent, was present as an impurity.

The lattice constant, as measured by x-ray diffration (using molybdenum radiation) was 12.381 ± 0.004 Angstroms. This matched the gadolinium gallium garnet substrate employed.

The magnetic film had the following room temperature magnetic properties: wall energy, 0.22 erg/cm²; saturation magnetization, 250 Gauss; translational wall coercivity, 0.2 Oersteds; and high field wall mobility, 370 cm/second Oersted. The wall energy obtained implies that films having a saturation magnetization of 150 Gauss will produce bubbles up to about 6 microns in diameter. Operating bubble diameter is relatively stable at temperatures within the range of about 01–100° C.

The Faraday rotation at 6328 Angstrom was 0.67°/μ (as compared to 0.058°/μ for a conventional $(YEu)_3(FeGa)_5O_{12}$ garnet).

We claim:

1. A flux composition from which single crystal garnet films having growth induced uniaxial anisotropy can be epitaxially grown which comprises essentially of about 75 mol percent of lead oxide, about 15 mol percent of bismuth oxide, from about 8 – 8.5 mol percent of iron oxide, from about 0.5 – 1.0 mol percent of an oxide selected from one or more of the group consisting of yttrium oxide and trivalent rare earth oxides and from about 1 – 1.5 mol percent of gallium oxide, aluminum oxide or a mixture of gallium and aluminum oxides.

2. A flux composition according to claim 1 wherein about 8.4 mol percent of iron oxide, about 0.5 mol percent of thulium oxide and about 1.1 mol percent of gallium oxide is present.

* * * * *